United States Patent [19]

Miyoshi et al.

[11] Patent Number: 4,890,029
[45] Date of Patent: Dec. 26, 1989

[54] ELECTRON BEAM APPARATUS INCLUDING PLURALITY OF ION PUMP BLOCKS

[75] Inventors: Motosuke Miyoshi, Fujisawa; Katsuya Okumura, Yokohama, both of Japan

[73] Assignee: Kabushiki Kaisha Toshiba, Kawasaki, Japan

[21] Appl. No.: 80,668

[22] Filed: Aug. 3, 1987

[30] Foreign Application Priority Data

Aug. 20, 1986 [JP] Japan .................................. 61-194588

[51] Int. Cl.$^4$ ............................................. H01J 7/16
[52] U.S. Cl. ........................................ 313/7; 313/336; 315/85
[58] Field of Search ....................... 313/7, 336; 315/85

[56] References Cited

U.S. PATENT DOCUMENTS

| | | | |
|---|---|---|---|
| 3,228,589 | 1/1966 | Kearns | 313/7 X |
| 3,376,455 | 4/1968 | Jepson | 313/7 X |
| 3,382,388 | 5/1968 | Henderson et al. | 313/7 |
| 3,588,563 | 6/1971 | Schmidt | 313/7 |
| 3,631,280 | 12/1971 | Levin et al. | 313/7 |
| 3,866,077 | 2/1975 | Baker et al. | 313/336 |
| 3,931,519 | 1/1976 | Coates | 313/336 X |

FOREIGN PATENT DOCUMENTS

| | | | |
|---|---|---|---|
| 2605339 | 8/1976 | Fed. Rep. of Germany | 313/7 |
| 115969 | 12/1979 | German Democratic Rep. | |
| 0139462 | 12/1978 | Japan | 313/7 |
| 2133610 | 7/1984 | United Kingdom | |

OTHER PUBLICATIONS

Hainfeld, "Understanding and Using Field Emission Source", Scanning Electron Microscopy, ITT Research Institute, vol. I, pp. 591–604, Mar. 1977.

Primary Examiner—Palmer C. DeMeo
Attorney, Agent, or Firm—Finnegan, Henderson, Farabow, Garrett and Dunner

[57] ABSTRACT

An electron beam apparatus is disclosed which comprises a cylindrical chamber, ion pump exhaust zones arranged in a substantially ring-like array, and an electron gun located on the center axis of the ring-like array, thereby minimizing the distance between the exhaust zone of an ion pump and the electron gun for generating an electron beam. Since the ion pump exhaust zones are located immediately next to the electron gun, it is therefore possible to achieve substantially the same vacuum level at the location of the electron gun as that at the ion pump per se.

6 Claims, 5 Drawing Sheets

ELECTRON BEAM APPARATUS INCLUDING PLURALITY OF ION PUMP BLOCKS

BACKGROUND OF THE INVENTION

This invention relates to an electron beam apparatus such as an electron microscope and, in particular, to an improved gas exhaust system for use in an anode chamber for an electric field releasing type electron gun which requires a high vacuum level.

In general, the performance of an electron beam apparatus, such as an electron microscope, is greatly influenced by the brightness of the electron gun (corresponding to an emitting current density for a unit solid angle).

A thermal electron emitting type electron gun has been reduced to practice which uses lanthanum hexaborite as a cathode material for obtaining a high brightness level. Consequently, the field emission type electron gun has a wide range of applications. Tungsten and titanium carbide are primarily used as the cathode material of the field emission type electron gun. In order for the electron gun to operate stably, it is necessary that a high vacuum level, of the order of $10^{-9}$ to $10^{-11}$ Torrs, be obtained.

Generally, as shown in FIG. 1, ion pump 11 is coupled to gun chamber 13 of electron gun 15, via exhaust tube 12. The exhausting of a gas within gun chamber 13 is carried out by a residual gas trap section (i.e., exhaust zone) within ion pump 11.

FIG. 2 shows one form of gas exhaust section 14 incorporated within ion pump 11. In FIG. 2, 21 shows cylindrical electrodes biased to a positive potential; 22 shows a parallel magnetic field; and 231 and 232 show plate-like electrodes biased to a negative potential, which function as getters. In the ion pump, magnetic field 22 is applied in a direction parallel to the axis of cylindrical electrodes 21 and electrons within cylindrical electrodes 21, accelerated by the electric field generated among electrodes 21 and 231, 232, are moved in spiral fashion.

In the current technique, a vacuum level attained by the ion pump per se is of the order of $10^{-10}$ Torrs. In the arrangement shown in FIG. 1, the large distance between electron beam emitting section 10 and gas exhaust section 14 within ion pump 11, arises due to the mechanical geometry of ion pump 11, exhaust tube 12, and anode chamber 13. Even if a vacuum level of the order of $10^{-11}$ Torrs is obtained at the location of the ion pump, the vacuum level of anode chamber 13 drops to about $10^{-9}$ to $10^{-10}$ Torrs. Thus, in the conventional apparatus, as shown in FIG. 1, the vacuum level within the anode chamber is reduced by one to two orders of magnitude in comparison with that obtained at the ion pump.

In order to eliminate the aforementioned drawbacks, two solutions can be considered: (1) ion pump 11 is located as near to gun chamber 13 as possible, and (2) the exhausting capacity of ion pump 11 is made as large as possible. In the case of solution (1), there is a limit as to how close ion pump 11 can be located vis-a-vis chamber 13, due to exhaust tube 12 and flange 120 being interposed therebetween. With respect to solution (2), other problems arise, such as the price, size, and weight of various large-capacity ion pumps.

SUMMARY OF THE INVENTION

The object of this invention is to provide an electron beam apparatus which can achieve substantially the same vacuum level at the gun chamber, for the generation of an electron beam, as that at an ion pump per se.

Another object of this invention is to provide an electron beam apparatus which combines the gun chamber and ion pump as one unit, so that a high vacuum level can be achieved without the need to increase, for example, the size and weight of the apparatus.

In order for the aforementioned objects to be attained, a gun chamber of the electron beam apparatus contains a substantially ring-like array of ion pump exhaust zones, with an electron gun centered in the ring-like array, to thereby minimize the distance between the exhaust zones of the ion pump and the electron gun for generating an electron beam.

Since the exhaust zones of the ion pump are located near the electron gun, it is possible to achieve substantially the same vacuum level at the location of the electron gun as that at the ion pump per se, without the need to increase the size, weight, and so on of the apparatus, as in the prior art.

DETAILED DESCRIPTION OF THE PREFERRED EMBODIMENTS

Figure 1:
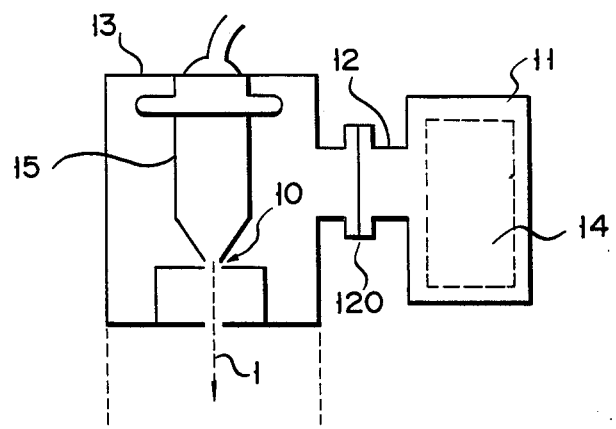
FIG. 1 is a diagrammatic view showing an electron beam apparatus using a conventional ion pump.

The electron beam apparatus according to this invention will now be explained below, with reference to the accompanying drawings. In FIGS. 3 to 7, the same reference numerals are employed to designate like parts or elements for the sake of simplicity.

Figure 3:
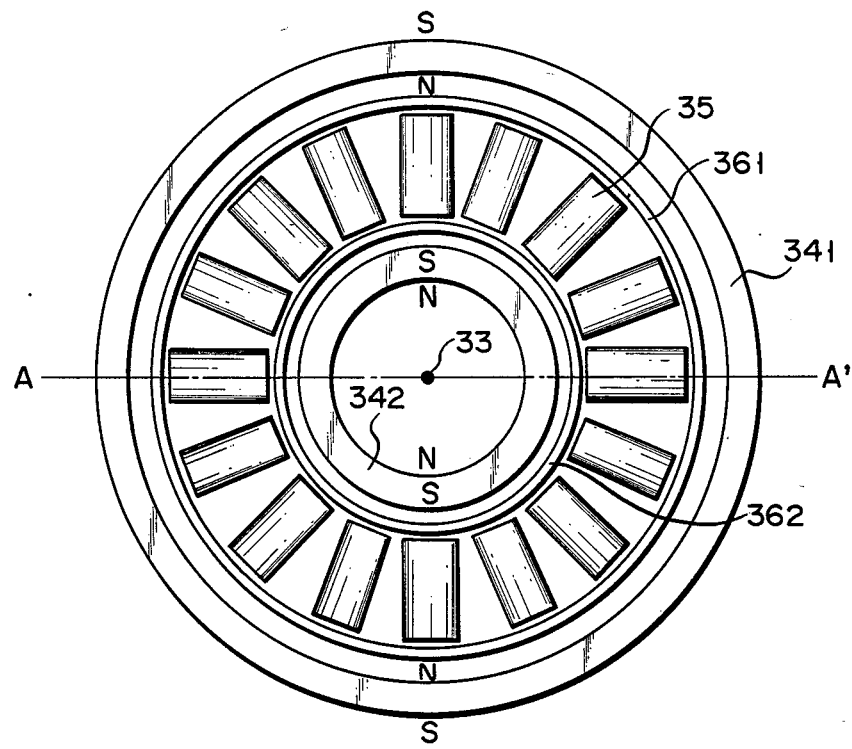
FIG. 3 is a view in horizontal cross-section showing an electron beam apparatus according to one embodiment of this invention.
Figure 4:
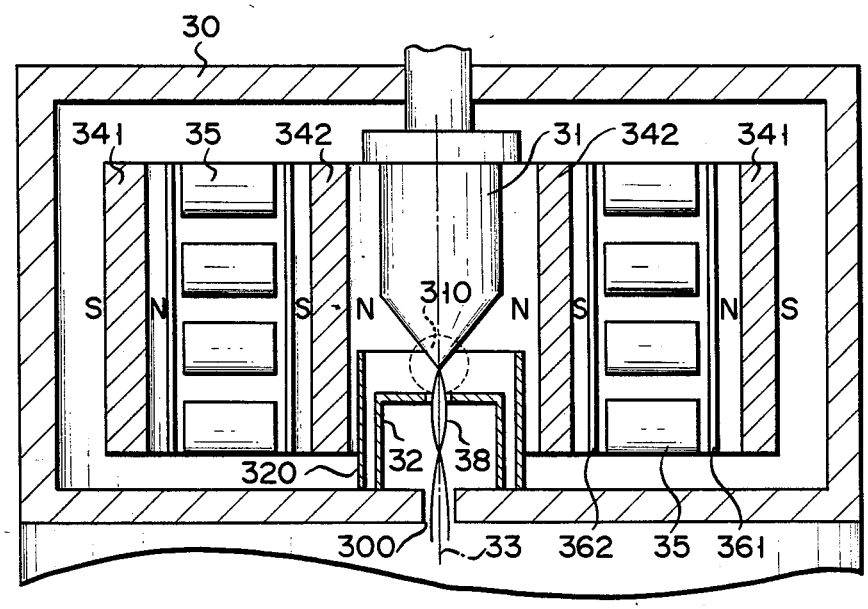
FIG. 4 is a transverse cross-sectional view of the apparatus of FIG. 3, taken along line A—A' thereof.
Figure 5:
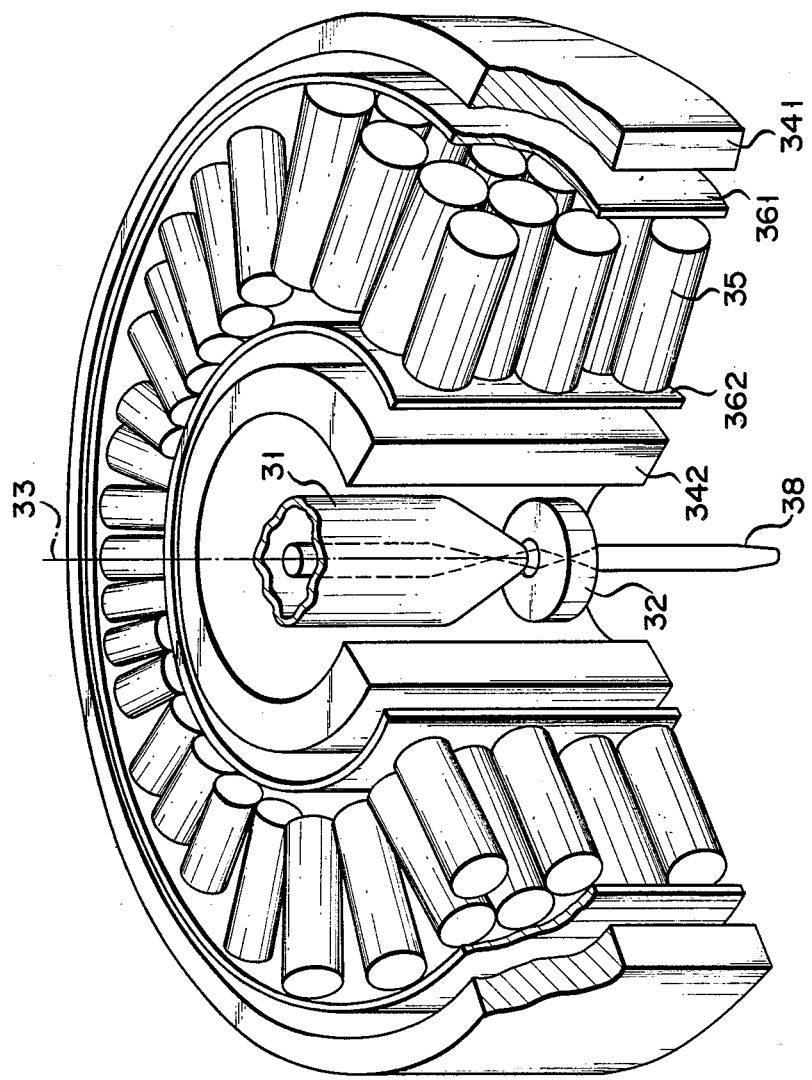
FIG. 5 is a partial, perspective view showing the embodiment of FIG. 3.

FIG. 3 is a horizontal, cross-sectional view showing an ion pump-equipped electron beam apparatus (electron gun and others) according to one embodiment of this invention. FIG. 4 is a cross-sectional view of the apparatus, taken along line A—A' in FIG. 3. FIG. 5 is a partially cut-away perspective view showing an arrangement of the apparatus of FIG. 3.

The arrangement of gun chamber 30 in this embodiment will now be explained below.

Electron gun 31 is arranged coaxial with axis 33 of cylindrical gun chamber 30, and anode 32 made of, for example, iron is located at the forward end side (a lower area in FIG. 4) of electron gun 31. Anode 32 has a pinhole on axis 33 of gun chamber 30, through which the electron beam passes. Magnetic shield 320 of a cylindrical configuration, such as Permalloy, is located outside of anode 32, such that it partially covers electron beam emitting end 310 of electron gun 31. Electron beam 38 emitted from electron gun 31 is accelerated by positively biased anode 32, and the accelerated beam 38 is output, via the pinhole of anode 32 and bottom hole 300 of gun chamber 30, to the exterior of chamber 30.

Ring-like permanent magnets 341 and 342 are mounted outside of electron gun 31 and magnetic shield 320, such that they are located concentric with axis 33 of gun chamber 30. These magnets are set, for example, with the N pole inside of external magnet 341 and the S pole outside of internal magnet 342. Between permanent magnets 341 and 342 are created a ring-like static magnetic field radially spread with axis 33 of anode chamber 30 as an origin. The strength of the static magnetic field is selected to be about 1000 to 2000 gauss.

In this arrangement thus obtained, a magnetic null point is situated on the center axis of ring-like magnets 341 and 342 and thus on axis 33 of anode chamber 30. Consequently, electron beam 38 is hardly affected by the aforementioned radial static magnetic field even if magnetic shield 320 is not used. According to the arrangement of FIGS. 3-5, however, any adverse influence due to said static magnetic field can more completely be eliminated by providing magnetic shield 320.

Between permanent magnets 341 and 342 are provided a plurality of cylindrical positive electrodes 35 which are equidistantly located with their axes oriented to the direction of the radial static magnetic field. Electrodes 35 are made of, for example, stainless steel or aluminum, which hardly evolve any gas.

Cylindrical gettering electrodes 361 and 362 are located one at each side of the radial array of electrodes 35, such that electrodes 361 and 362 are placed coaxial with axis 33 of gun chamber 30. Gettering electrodes 361 and 362 are usually made of titanium, but a zirconium- or magnesium-based gettering material can be used for gettering electrodes.

Gettering electrodes 361 and 361 are normally circuit-grounded and a plurality of positive electrodes 35 are biased to a high voltage potential of about 3 to 7 kV. The gas exhausting operation as an ion pump is performed between positive electrodes 35 and gettering electrodes 361 and 362.

In the embodiment shown in FIGS. 3 to 5, within gun chamber (vacuum container) 30, electron gun 31 is located in close proximity to the gas exhaust operation section of the ion pump comprised of a plurality of blocks. (Here, each block of the ion pump is comprised of some positive electrodes 35 and gettering electrodes 361 and 362.) For this reason, a high vacuum level substantially equal to the exhausting capability of the ion pump per se can be obtained at the electron beam emitting zone (310) of electron gun 31.

Inside of inner magnet 342, electron beam 38 is automatically shielded from the surrounding magnetic flux since beam 38 is on a magnetic null area not linked with the ambient magnetic flux. For this reason, magnetic shield 320 can be omitted as the case may be.

Figure 6:
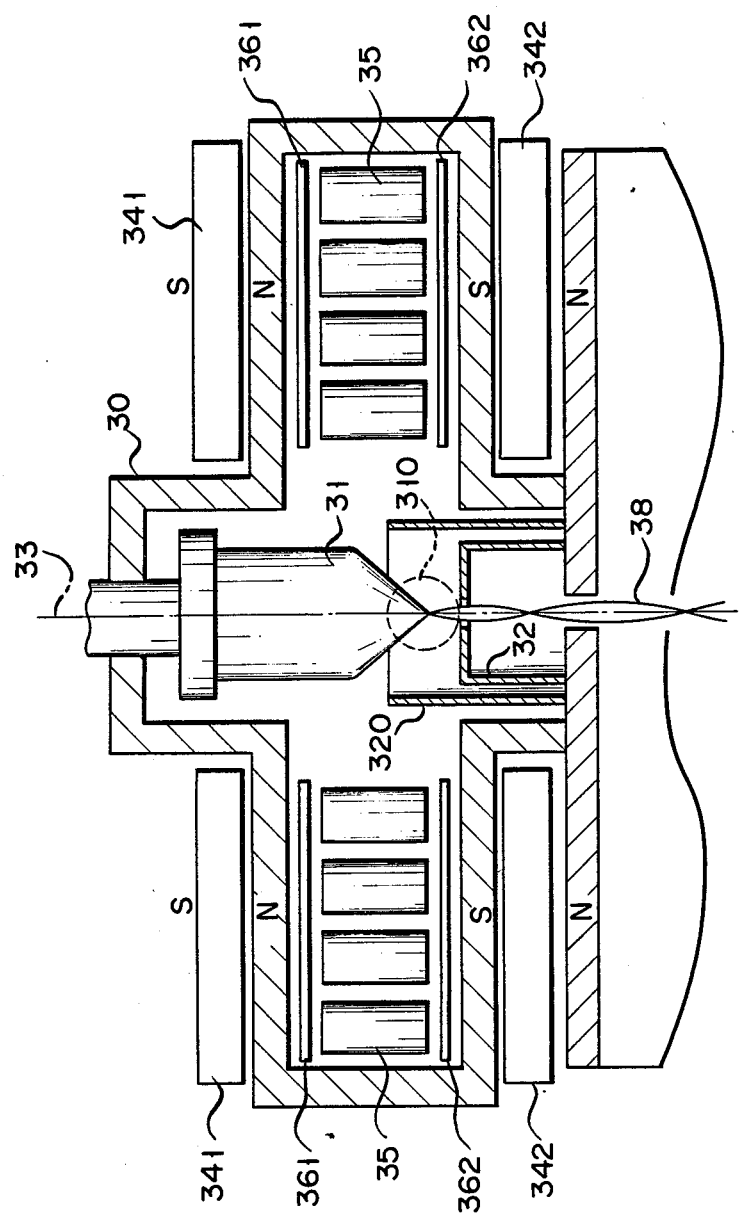
FIG. 6 is a transverse, cross-sectional view showing an electronic beam apparatus according to another embodiment of this invention.

FIG. 6 shows an electron beam apparatus according to another embodiment of this invention. Electron gun 31 is mounted within two-stepped, cylindrical gun chamber 30 with a large-diameter section, such that gun 31 is located coaxial with the axis of cylindrical gun chamber 30. Anode 32 made of iron and cylindrical magnetic shield 320 made of Permalloy are positioned coaxial with the axis of gun chamber 30.

A pair of sliced pineapple-like ring type gettering electrodes 361 and 362 are mounted within the largediameter section of cylindrical gun chamber 30, such that each center of these ring electrodes (361, 362) is located concentric with the axis of the anode cylinder (30). Electrodes 361 and 362 are made of, for example, titanium.

A plurality of cylindrical positive electrodes 35 are equidistantly placed between electrodes 361 and 361. These electrodes 35 can be replaced by an integral honeycomb structure. The electrodes may be made of, for example, aluminum.

A pair of sliced pineapple-like ring type permanent magnets (or electromagnets) 341 and 342 are mounted at the outside of the large-diameter section of two-stepped cylindrical gun chamber 30, such that the ring magnets are located coaxial with the axis of cylindrical gun chamber 30. A static magnetic field parallel to the axis of cylindrical positive electrodes 35 is created by magnets 341 and 342 at the ion pump zone (35, 361, 362) within gun chamber 30. The intensity of the parallel magnetic field is selected to be usually of the order of 1000 to 2000 gauss.

In the embodiment shown in FIG. 6, permanent magnets 341 and 342 are mounted outside of gun chamber 30 to allow ready exchange of them. The strength of the aforementioned parallel magnetic field can readily be varied by replacing permanent magnets 341 and 342 by new ones. When magnets 341 and 342 are of an electromagnetic type, the strength of the aforementioned parallel magnetic field can simply be changed by varying that excitation current.

In the arrangement shown in FIG. 6, no null point is created in the magnetic field on the electron beam path from electron gun 31. For this reason, magnetic shield 320 is disposed around the outer periphery of anode 32 such that shield 320 is located high at a positional level covering electron beam emitting end 310. Magnetic shield 320 of the embodiment of FIG. 6 is more needed than for the embodiment shown in FIG. 4.

In the electron beam apparatus shown in FIG. 6, any hindrance, such as magnet 342 in FIG. 4, does not exist between the gas exhaust zone (35, 361, 362) of the ion pump and electron beam emitting end 310, so that the effective distance between the gas exhaust zone of the ion pump and electron beam emitting end 310 can be further decreased as compared with that for the embodiment shown in FIG. 4.

Since magnets 341 and 342 are not located within gun chamber 30, it is possible to reduce an inner capacity of gun chamber 30. Thus, a higher discharge efficiency can be obtained in the arrangement of FIG. 6 than that in the arrangement shown in FIG. 4.

In the arrangement shown in FIG. 4, magnets 341 and 342 should not be made of any material which evolves gas. In the arrangement of FIG. 6, however, the material of these magnets is not restricted to a gasevolution-free material.

Figure 7:
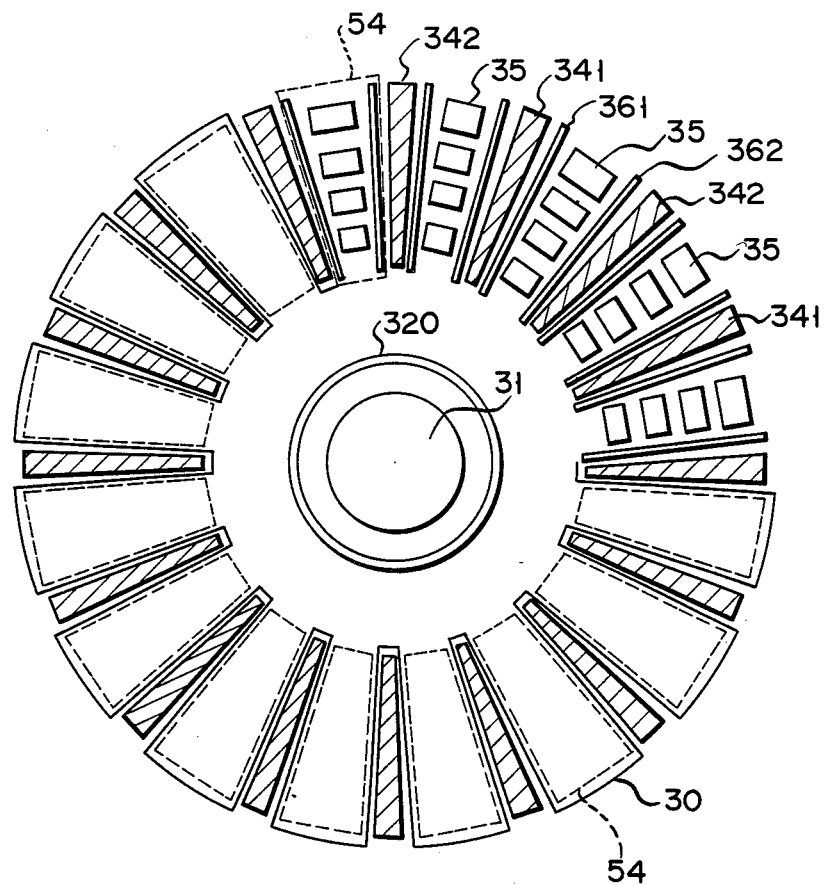
FIG. 7 is a horizontal, cross-sectional view showing an electronic beam apparatus according to still another embodiment of this invention.

FIG. 7 shows an ion beam apparatus according to still another embodiment of this invention. In this embodiment a number of wedge-like plate magnets 341 and 342 are alternately arranged as a radial array. These magnets are provided in place of ring type magnets 341 and 342 of FIG. 3, and are located relative to cylindrical positive electrodes 35 and gettering electrodes 361 and 362 in a manner as follows.

A plurality of cylindrical positive electrodes 35 are equidistantly arranged between two adjacent permanent magnets 341 and 342 with the axis of the cylindrical positive electrodes oriented in a direction of a static magnetic field which is created between permanent magnets 341 and 342. Cylindrical positive electrodes 35 are grouped into blocks such that the opposite ends of positive electrodes 35 face the corresponding gettering electrodes 361 and 362. Gettering electrodes 361 and 362 are alternately arranged as a radial array with respect to the center axis of cylindrical magnetic shield 320, such that electrodes 361 and 362 extend substantially parallel to magnets 341 and 342. Cylindrical magnetic shield 320 is located around electron gun 31 as in the case of the embodiment of FIG. 6.

In the embodiment shown in FIG. 7, each of those zones surrounded by broken lines 54 corresponds to the exhaust section of each block in the ion pump.

Gun chamber 30 has wedge-like cutouts in a radial pattern with plate magnets 341 and 342 alternately placed in the corresponding wedge-like cutouts, i.e., outside of gun chamber 30, in a one-to-one correspondence. In the arrangement shown in FIG. 7, magnets 341 and 342 can readily be replaced by new ones. Furthermore, the inner capacity of gun chamber 30 can be reduced to an extent that magnets 341 and 342 are provided outside of gun chamber 30, not within gun chamber 30. As magnets 341 and 342, use may also be made of magnets which are liable to evolve gas under a very low pressure level.

According to this invention, the exhaust zone of the ion pump is created, in proximity to electron gun 31, within the same vacuum container (30), allowing a very high vacuum level to be attained at the electron beam emitting end (310). In the arrangement shown in FIG. 4, electron gun 31 is located at a null point in the magnetic field of magnets (341, 342), so that the ambient magnetic field hardly exercises any influence over electron beam 38.

Figure 2:
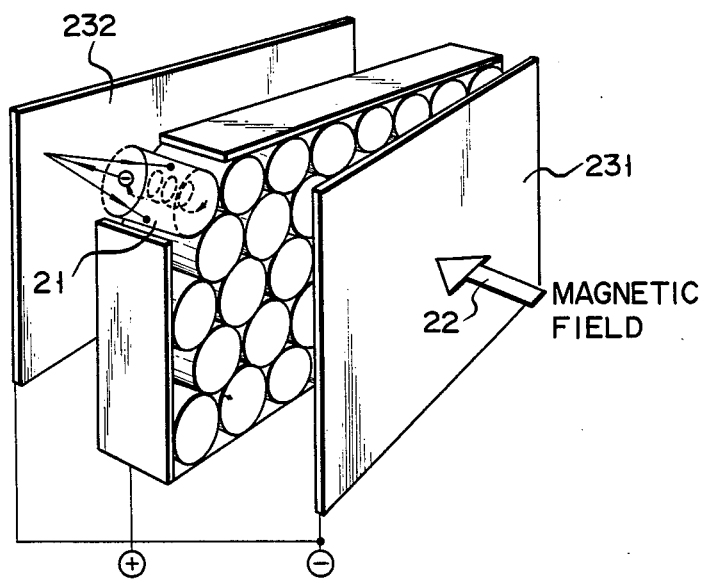
FIG. 2 is a perspective view showing one form of an exhaust section within the ion pump of FIG. 1.

This invention is not restricted to the aforementioned embodiments, and can be modified in a variety of ways within the scope of this invention. For example, electrodes 35 can be replaced by an electromagnet (solenoid) in which case magnets 341 and 342 can be omitted. A plurality of sets of blocks each comprised of a flat array of ion pumps (as shown in FIG. 2) may be equidistantly arranged around electron gun 31 within vacuum container 30. Furthermore, gettering electrodes 361 and 362 may be not only flat in configuration but also a mesh-like or unevenly curvilinear in configuration.

What is claimed is:

1. An electron beam apparatus comprising:
a vacuum chamber;
an electron gun located within said vacuum chamber; and
an ion pump including a plurality of ion pump blocks arranged around said electron gun, each of said ion pump blocks having a plurality of cylindrical positive electrodes, a plurality of negative getter electrodes located one at each side of said positive electrodes, and magnetic field creating means, located within said vacuum chamber, for producing, in the area of said positive electrodes, a magnetic field containing magnetic field components parallel to the axes of said positive electrodes, said magnetic field creating means including an inner ring magnet located coaxial with the axis of said electron gun, and an outer ring magnet located coaxial with the axis of said inner ring magnet, said cylindrical positive electrodes and said negative getter electrode being located between said inner ring magnet and said outer ring magnet.

2. An electron beam apparatus according to claim 1, further comprising a magnetic shield member located around an electron beam emitting portion of said electron gun.

3. An electron beam apparatus comprising:
a vacuum chamber;
an electron gun located within the vacuum chamber; and
an ion pump comprising an plurality of ion pump blocks arranged around said electron gun, each of said ion pump blocks comprising a plurality of cylindrical positive electrodes, negative getter electrodes located one at each side of said positive electrodes, and magnetic field creating means, located within said vacuum chamber, for producing, in the area of said positive electrodes, a magnetic field containing magnetic components parallel to the axes of said positive electrodes;
wherein said magnetic field creating means comprises a pair of ring-like magnets between which said positive electrodes and said negative getter electrodes are enclosed.

4. An electron beam apparatus according to claim 3, wherein said electron gun is located at a center region of an array of said ion pump blocks at which a strength of said magnetic field is at a minimum.

5. An electron beam apparatus according to claim 3, further comprising a magnetic shield member located around an electron beam emitting portion of said electron gun.

6. An electron beam apparatus according to claim 3, wherein an axis of said electron gun is coincident with a center axis of said magnetic field.

* * * * *